United States Patent
Polichar et al.

(10) Patent No.: US 7,064,082 B2
(45) Date of Patent: Jun. 20, 2006

(54) METHODS FOR FORMING PIN ALLOY-SEMICONDUCTOR DEVICES WITH RECTIFYING JUNCTION CONTACTS

(75) Inventors: Raulf M. Polichar, San Diego, CA (US); Kuo-Tong Chen, San Diego, CA (US)

(73) Assignee: Science Applications International Corporation, San Diego, CA (US)

( * ) Notice: Subject to any disclaimer, the term of this patent is extended or adjusted under 35 U.S.C. 154(b) by 134 days.

(21) Appl. No.: 10/757,457

(22) Filed: Jan. 15, 2004

(65) Prior Publication Data

US 2004/0185672 A1    Sep. 23, 2004

Related U.S. Application Data

(63) Continuation of application No. 09/736,157, filed on Dec. 15, 2000, now Pat. No. 6,803,322.

(51) Int. Cl.
*H01L 21/461* (2006.01)
*H01L 21/302* (2006.01)

(52) U.S. Cl. ...................................... 438/745; 438/746
(58) Field of Classification Search ........ 438/707–709, 438/745, 746, 754
See application file for complete search history.

(56) References Cited

U.S. PATENT DOCUMENTS

| | | | | |
|---|---|---|---|---|
| 4,369,099 A | * | 1/1983 | Kohl et al. | 205/646 |
| 4,482,442 A | * | 11/1984 | Kohl et al. | 428/411.1 |
| 4,710,589 A | * | 12/1987 | Meyers et al. | 136/258 |
| 5,129,981 A | * | 7/1992 | Wang et al. | 205/646 |
| 5,338,416 A | * | 8/1994 | Mlcak et al. | 205/643 |
| 5,348,627 A | * | 9/1994 | Propst et al. | 205/655 |
| 5,637,189 A | * | 6/1997 | Peeters et al. | 438/466 |

* cited by examiner

*Primary Examiner*—Zandra V. Smith
*Assistant Examiner*—Khanh Duong
(74) *Attorney, Agent, or Firm*—Kilpatrick Stockton LLP

(57) ABSTRACT

The present invention pertains to a more efficient system and method for forming rectifying junction contacts in PIN alloy-semiconductor devices using photoelectrical and chemical etching. The present invention provides a means of creating rectifying junction contacts on alloy-semiconductor devices such as CdTe and CdZnTe, among others. In addition, the present invention also provides a simple and low cost method for revealing wafer surface morphology of alloy-semiconductors, thus providing an efficient and effective means for selecting single grain semiconductor substrates. Further, the present invention provides radiation detectors employing such alloy-semiconductor devices having improved rectifying junctions as the detector element.

16 Claims, 11 Drawing Sheets

METHODS FOR FORMING PIN ALLOY-SEMICONDUCTOR DEVICES WITH RECTIFYING JUNCTION CONTACTS

This application is a continuation of and claims priority to U.S. patent application Ser. No. 09/736,157 entitled "PIN ALLOY-SEMICONDUCTOR, RADIATION DETECTORS WITH RECTIFYING JUNCTION CONTACTS, METHODS AND SYSTEMS FOR FORMING PIN ALLOY-SEMICONDUCTOR DEVICES WITH RECTIFYING JUNCTION CONTACTS, AND SYSTEMS AND METHODS FOR ANALYZING ALLOY-SEMICONDUCTOR PROPERTIES," filed on Dec. 15, 2000, now issued at U.S. Pat. No. 6,803,322.

BACKGROUND OF THE INVENTION

1. Field of the Invention

The present invention relates to alloy-semiconductor radiation detectors with rectifying junction contacts, the formation of rectifying junction contacts on alloy-semiconductors using photo-electrochemical etching, the use of such alloy-semiconductor devices with rectifying junction contacts in PIN ionization detector devices, and systems and methods for revealing surface morphology of such alloy-semiconductors.

2. Description of the Related Art

Several methods have been developed for the external formation of P- and N-type contacts on CdTe and CdZnTe for Positive-Intermediate-Negative (PIN) devices. For example, X. Li, et al., "Effect of nitric-phosphoric acid etches on material properties and back-contact formation of CdTe-based solar cells," *Journal of Vacuum Science Technology A*, 17(3), May/June, 1999; R. Sudharsanan et al., "Fabrication and characterization of CdZnTe radiation detectors with a new P-I-N design," presented at the 1996 U.S. Workshop on the Physics and Chemistry of II-VI Materials, 1996; A. Khusainov et al., "Performance of a high resolution CdTe and CdZnTe P-I-N detectors," *Nuclear Instruments and Methods in Physics Research A*, 380, 245–251, 1996; T. Narita et al., "Development of prototype pixellated PIN CdZnTe detectors," *Proceeding of the SPIE*, 3446, 1998; S. U. Egarievwe et al., *Proceeding of SPIE*, 3768, 1999; T Narita et al., "Development of IMARAD CZT detectors with PIN contacts," *Proceeding of SPIE*, 3768, 1999; M. Niraula et al., "Fabrication of CdTe detectors in a P-I-N design for gamma-ray spectroscopy," *Proceeding of SPIE*, 3768, 1999; M. Niraula et al., "Fabrication and performance of P-I-N CdTe radiation detectors," *Nuclear Instruments and Methods in Physics Research A*, 436, 132–137, 1999; and T. Takahashi et al., "High-resolution Schottky CdTe diode for hard X-ray and gamma-ray astronomy," *Nuclear Instruments and Methods in Physics Research A*, 436, 111–119, 1999, all describe various methods for forming an external P-type and/or N-type contacts on CdTe and CdZnTe for PIN semiconductor devices.

However, all these methods suffer from several shortcomings. First, these conventional methods all involve sophisticated vacuum deposition equipment. This necessarily entails that production of semiconductor devices using such methods are expensive and difficult. Second, these conventional methods also require high temperature heating during formation of the contacts, which heating can cause degradation of semiconductor's material properties. Third, because the metal used in the metal deposition process may be impure, the semiconductor device can become contaminated during the metal deposition process. Fourth, it is possible that the interface between the deposited metal and semiconductor device may have an oxide layer that can degrade device performance. Thus, there remains a need for an improved system and method for forming rectifying junction contacts in PIN alloy-semiconductor devices. There also remains a need for a PIN ionization detector device utilizing such alloy-semiconductor devices with rectifying junction contacts. Further, there remains a need for an efficient and inexpensive method for revealing surface morphology of alloy-semiconductors. These advantages have been obtained with the present invention.

BRIEF SUMMARY OF THE INVENTION

Accordingly, it is an object of the present invention to provide a more efficient system and method for forming rectifying junction contacts in PIN alloy-semiconductor devices using photo-electrochemical etching.

It is another object of the present invention to provide a more efficient system and method for forming rectifying junction contacts in PIN alloy-semiconductor devices in which there is no external contamination arising from impurities in the metal being deposited.

It is a further object of the present invention to provide a more efficient system and method for forming rectifying junction contacts in PIN alloy-semiconductor devices in which there is no oxide layer to degrade device performance.

It is still another object of the present invention to provide a more efficient system and method for forming rectifying junction contacts in PIN alloy-semiconductor devices, which method employs a room temperature process.

It is another object of the present invention to provide a more efficient system and method for forming rectifying junction contacts in PIN alloy-semiconductor devices in which fine contacts are produced easily.

It is a further object of the present invention to provide a more efficient system and method for forming rectifying junction contacts in PIN alloy-semiconductor devices in which there is lower leakage between adjacent contacts because the etch is recessed.

It is still another object of the present invention to provide a more efficient system and method for forming rectifying junction contacts in PIN alloy-semiconductor devices in which higher internal electric fields are possible, thereby improving charge collection.

It is another object of the present invention to provide a more efficient system and method for forming rectifying junction contacts in PIN alloy-semiconductor devices in which there is lower leakage current, producing an improved detector.

It is a further object of the present invention to provide a more efficient system and method for forming rectifying junction contacts in PIN alloy-semiconductor devices which results in lower production costs.

It is still another object of the present invention to provide a method for revealing surface morphology of alloy-semiconductors.

It is a further object of the present invention to provide a method for revealing surface morphology of such alloy-semiconductors such that high yields of single crystalline material can be obtained.

It is still another object of the present invention to provide a method for revealing surface morphology of such alloy-semiconductor which provides for visual mapping of the areas of maximum electron transport, which is closely related to good charge collection within a detector.

These objects, among others, have been obtained by means of a more efficient system and method for forming rectifying junction contacts in PIN alloy-semiconductor devices using photo-electrochemical etching. The present invention provides a means of creating rectifying junction contacts on alloy-semiconductor devices such as CdTe and CdZnTe, among others. In addition, the present invention also provides a simple and low cost method for revealing wafer surface morphology of alloy-semiconductors, thus providing an efficient and effective means for selecting single grain semiconductor substrates. Further, the present invention provides nuclear detectors employing such alloy-semiconductor devices having improved rectifying junctions as the detector element.

BRIEF DESCRIPTION OF THE FIGURES

FIG. 6a is the SEM atomic fluorescence spectra of the cadmium and zinc enriched surface layer on a CdZnTe semiconductor device while

DETAILED DESCRIPTION OF THE INVENTION

Figure 1:
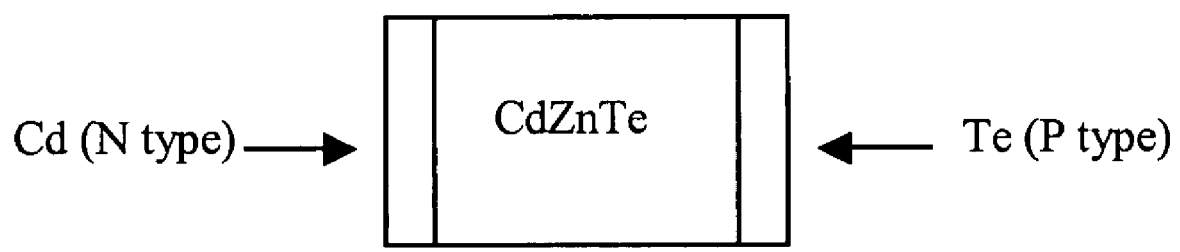
FIG. 1 is a schematic illustrating the PIN structure of a CdZnTe alloy-semiconductor.

Alloy-semiconductors, preferably CdTe and CdZnTe alloy-semiconductors, have found important applications in γ-ray detectors, X-ray detectors, electro-optical applications, and photovoltaic devices. These alloy materials, especially the CdTe and CdZnTe alloys, are excellent choices for the detector material in such spectroscopic applications because these materials have a near-ideal bandgap and high absorption coefficients. These wide bandgap compound semiconductor detectors have shown superior energy resolution relative to conventional scintillators at room temperature. Thus, such devices would find wide application in a variety of x-ray and gamma ray sensing applications. Unfortunately, it is has been difficult to efficiently form truly ohmic contacts with such alloy-semiconductors.

In typical bulk semiconductor devices having a high intrinsic resistivity, an ionization sensor for detecting nuclear radiation would be constructed by externally depositing ohmic (or near-ohmic) contacts on either side of a parallel plate structure and applying a bias voltage. To obtain the greatest sensitivity and accuracy, the potential would be distributed as evenly as possible across the device so as to produce a uniform electric field which would separate and collect the induced signals from the charge pairs formed by the nuclear ionization. However, in conventional detectors, the contacts are often non-ohmic and frequently have an oxide layer that separates the contacts from the semiconductor. These flaws reduce the strength of the electric field within the semiconductor and necessitate high voltage potentials so as to achieve adequate charge collection. But the increased voltage potential produces an increase in the leakage current in the semiconductor device, severely limiting the sensitivity and accuracy of the device. The use of a PIN structure (i.e., where there is a sequence of a positively doped layer of material (P), a negatively doped layer of material (N), and a layer of depleted or intermediate material (I) between the P layer and the N layer) in such alloy-semiconductor devices can decrease the leakage current relative to that of the bulk resistivity of the material. This occurs by means of the introduction of a blocking, or rectifying, contact into the path of the current.

While there have been some attempts to construct rectifying contacts on the surfaces of alloy-semiconductors, these approaches have numerous shortcomings. The conventional methods for forming rectifying contacts on such alloy-semiconductors involve sophisticated deposition equipment. Thus, these methods are expensive, difficult, and require specialized manufacturing equipment. Further, these conventional methods require heating to high temperatures during formation of the rectifying contacts; such heating can cause degradation of the material properties of the alloy-semiconductor. Additionally, because the metal used to deposit the rectifying contact or the processing environment may not be of sufficient purity, the semiconductor device can become contaminated during the metal deposition process. In addition, the interface between the deposited metal and semiconductor device is likely to have an oxide layer that can degrade the performance of the semiconductor device. Typically this results in a device that appears to have two Metal-Oxide Semiconductor (MOS) contacts, with their junctions oriented back to back, and causes a reduction in the internal field within the depletion region. Because of all these flaws present in the conventional methods, there remains a need for an improved system and method for forming rectifying junction contacts in PIN alloy-semiconductors.

The present invention pertains to a system and method for the formation of rectifying junctions on alloy-semiconductors. These rectifying contacts are formed by a combination of photo-electrochemical removal of one component of the alloy material and chemical etching of another component of the alloy so as to achieve a PIN structure for the semiconductor device.

An aspect of the present invention is the formation of metallic contacts on an alloy-semiconductor material by removal of one component of the alloy by means of photo-electrochemical action. In a preferred embodiment of the present invention, such photo-electrochemical action is performed in situ. In a particularly preferred embodiment of the present invention, utilizing CdTe and related alloys (such as CdZnTe) as the semiconductor material, the formation of the rectifying contacts occurs by removal of Te from one portion of the alloy, resulting in a metal surface enriched in, or consisting of, Cd metal (for CdTe) or of Cd and Zn for CdZnTe devices, which can function as an N-type contact. Another portion of the alloy material is treated with an acid to etch Cd, resulting in a metal surface enriched in, or consisting entirely, of Te, which can function as a P-type contact. This preferred embodiment is illustrated in FIG. 1, where the PIN structure for a CdZnTe alloy-semiconductor is provided.

The invention includes the process for formation of semiconductor contacts formed on alloy-semiconductors by photo-electrochemical removal of one component of the alloy and chemical etching to remove a second component of the alloy-semiconductor. In the case of the formation of a cadmium contact on CdTe/CdZnTe or similar alloy crystals, an exemplary process is described as follows. The process is equally viable for ternary or higher order alloys. This works as long as the pure metal form of the cation has a higher free negative carrier density (i.e., n type) than the bulk alloy and the stable form of the anion layer has a higher free positive carrier density (i.e., p type) than the intrinsic alloy itself. Examples of such semiconductor materials include HgZnCdTe, HgCdZnSe, and similar combinations of II-VI materials as well as other compounds which contain a stable metal element and a conductive stable form of the anion which can be enhanced on the opposite surface.

Figure 2:
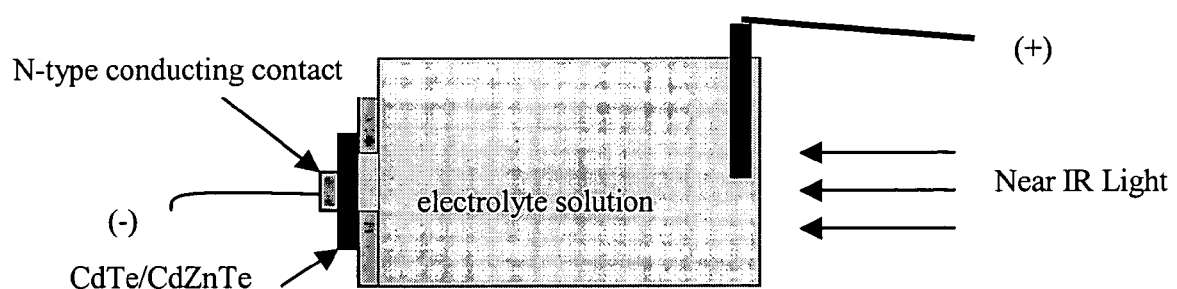
FIG. 2 is a schematic drawing of the photo-electrochemical formation of a Cd (or Cd—Zn) film on a CdTe/CdZnTe substrate.

In a preferred embodiment of the present invention, the alloy sample is deposited with a removable N-type conductive material, such as Hg—In eutectic paste, on one side which is connected to negative terminal of the power supply. This conductive side and all edges are then coated with a non-conductive material that resists the action of the base electrolyte used, typically KOH or NaOH. A graphite electrode is submerged in an electrolyte solution and connected to the positive terminal of the power supply. Then a high intensity, near-IR wavelength light source is employed to induce a high flux photo-current, resulting in a high reaction rate. One arrangement of the apparatus of the present invention is provided in FIG. 2. In this figure, the near-IR light source is used to both penetrate and excite electron-hole pairs within the semiconductor material providing a significant photocurrent that drives the reaction. The light source spectrum is centered approximately about the energy of the band gap of the semiconductor. In this region, the absorption of light is increasing rapidly with shorter wavelength. Since the absorption of light is highly dependent on the excitation of the semiconductor into states above the bandgap, it is precisely in this region where there is an advantageous balance between penetration and excitation of photocurrent and hence the most effective region in which to operate the light source and accelerate the reaction rate. The removal of the negative ion from the crystal and the formation of a stable acid is highly dependent on the pH of the electrolyte solution. It is found that the solution must be very basic, having a pH concentration of approximately 10.5 or higher, to make the reaction proceed with any effectiveness.

A voltage is then applied to the cell with the negative bias applied to the temporary n type contact on the protected side of the CdTe/CdZnTe crystal and the positive bias applied to the graphite electrode. This current results in an electrolytic reaction, in which oxygen gas is generated near the graphite electrode and free hydrogen is produced at the exposed alloy surface. The free hydrogen reacts with the alloy-semiconductor, forming $H_2Te$ gas via the reaction:

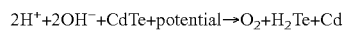

$2H^+ + 2OH^- + CdTe + \text{potential} \rightarrow O_2 + H_2Te + Cd$

Hydrogen telluride, a known gas, is evolved at the surface of the CdTe/CdZnTe crystal.

Figure 3:
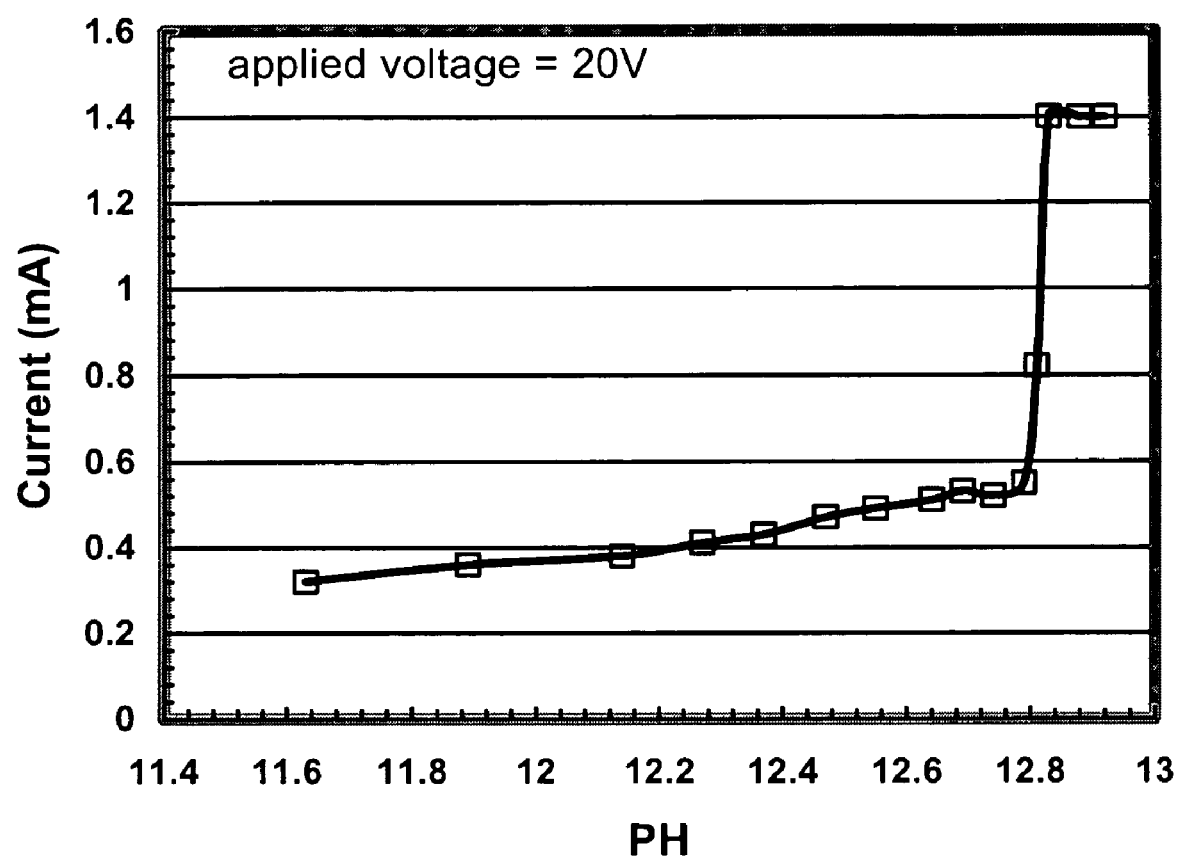
FIG. 3 is a chart of the reaction rate (determined by the measured electric current) for constant potential and illumination as a function of electrolyte pH.
Figure 4:
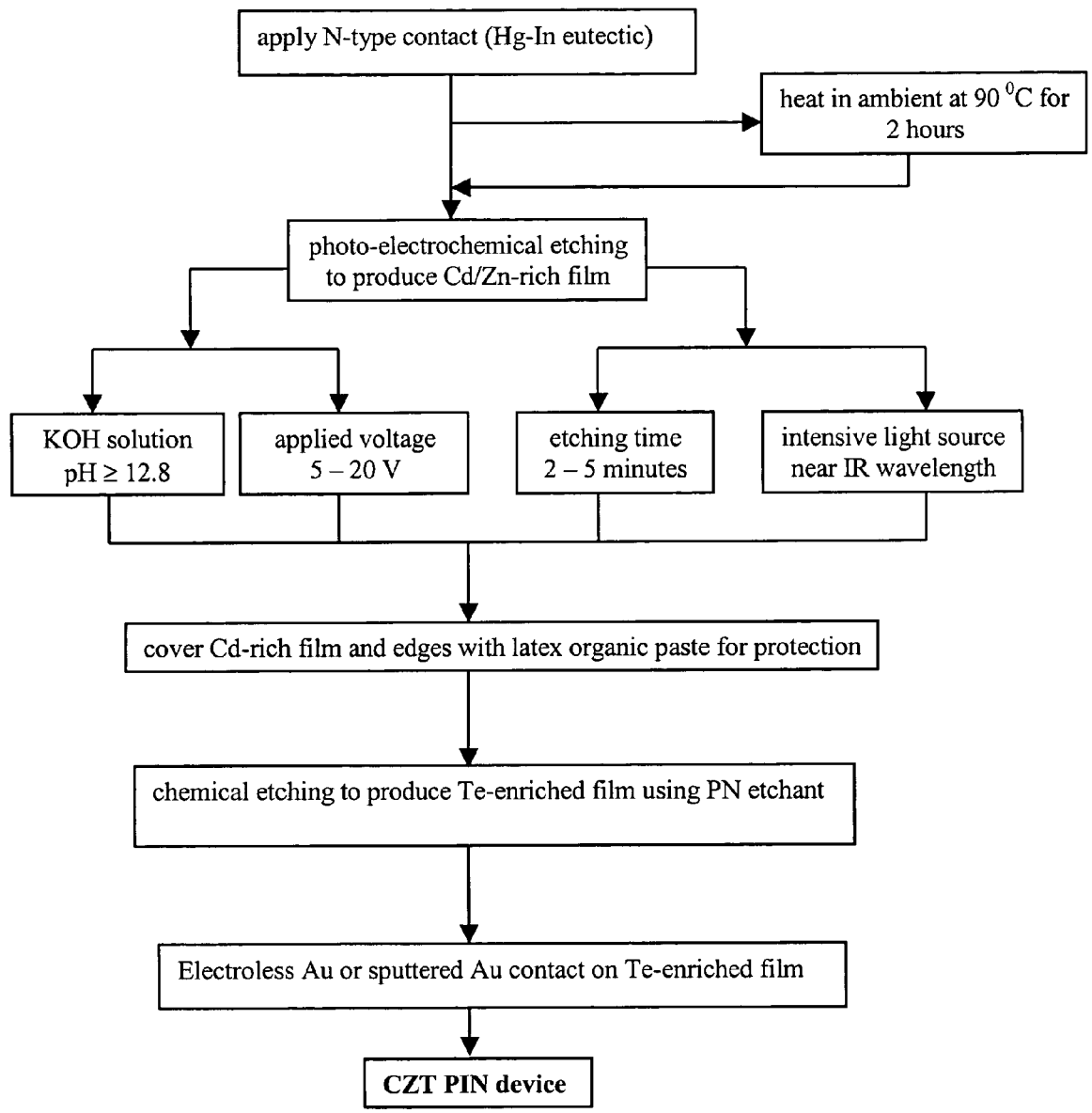
FIG. 4 provides a processing flow chart for a CdTe or CdZnTe PIN semiconductor, with regard to one preferred embodiment.

The resulting metal-semiconductor junction shows diode properties when operated under reversed polarity bias. The reaction rate is strongly dependent on the pH of the electrolyte solution and is evidenced by the dependance of the photocurrent in the reaction under constant illumination as a function of electrolyte pH as shown in FIG. 3. With 20 V applied as voltage, the reaction rate is significant and works optimally at pH values above 12.8. A preferred flow chart for the process of the present invention is illustrated in FIG. 4.

Figure 5:
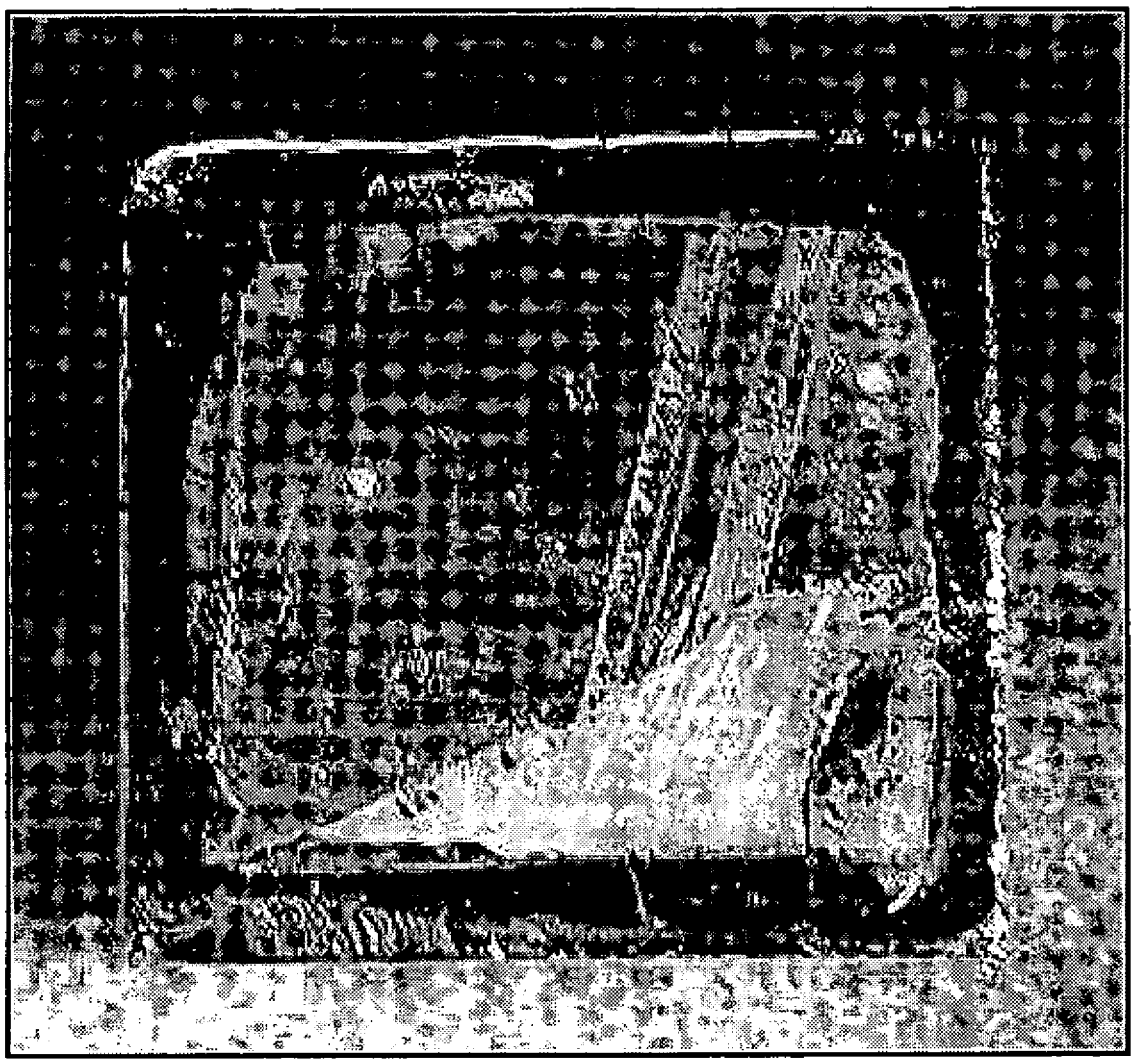
FIG. 5 is a photograph of a Cd—Zn layer formed on a CdZnTe detector by photo-electrochemical etching.

This process results in the formation of a Cd layer on a CdTe or a Cd/Zn layer on CdZnTe semiconductors. FIG. 5 is a photograph illustrating the formation of such a mixed Cd/Zn layer on a CdZnTe substrate.

Figure 6A:
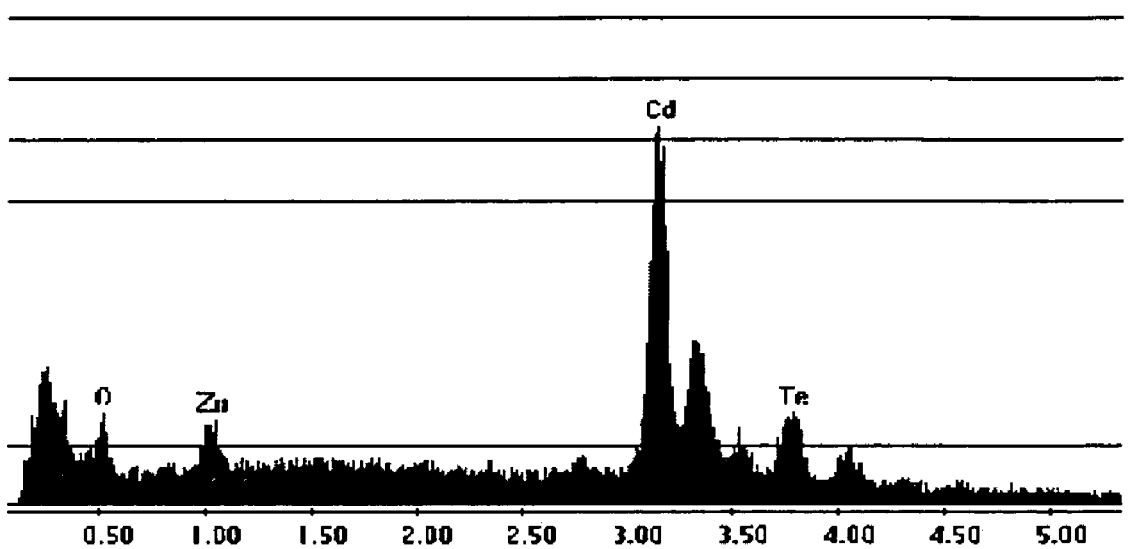
Figure 6B:
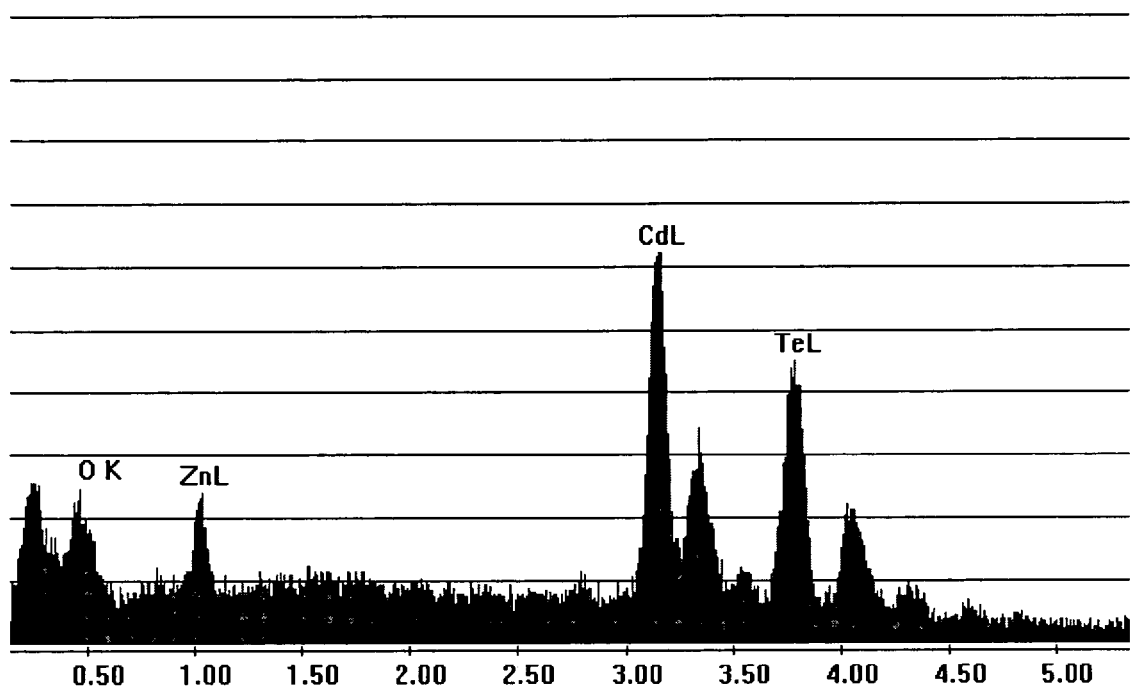
FIG. 6b shows the spectrum from a similar type of measurement with the beam focused on the native CdZnTe material on the same detector.

To examine the composition of the metallic layer formed in this process, scanning electron microscopy (SEM) and x-ray fluorescence was used to determine the chemical composition of the Cd/Zn layer after the photo-chemical etching process was completed. The white metal-like film illustrated in the photo of FIG. 5 was inspected using the SEM. FIG. 6 illustrates the resulting SEM fluorescence spectrum taken of this layer. The spectrum shows a Cd-enriched percent atomic composition of 64.55, 3.o3% of Zn and 25.46% of tellurium. The combined ratio of the metals Cd and Zn to Te is 2.65. FIG. 6 illustrates a spectrum taken on the native CdZnTe material off of the processed area and shows the expected concentrations of the three elements. If the CdZnTe material is stoichiometric in composition, one expects the SEM spectra to yield an atomic composition ratio between the combination of Cd and Zn to tellurium to be about 1:1. However if the material deviates from stoichiometry because the surfaces have been enhanced chemically, this ratio will reflect the relative changes in elemental composition. Because the electrons in the SEM beam react somewhat below the surface Cd and Zn layer and into the bulk material, there is a resulting dilution of the Cd/Zn signal by the bulk material below, the actual increase in atomic composition of Cd and Zn in the thin layer is somewhat higher then the SEM spectrum shown indicates.

Another aspect of the present invention is the formation of a P-type layer on an alloy-semiconductor. In a preferred embodiment of the present invention, a nitric acid/phosphoric acid based oxidizing etchant is used to etch out Cd or Cd/Zn from the surface of a CdTe or a CdZnTe alloy-semiconductor, respectively, to produce a Te-enriched region on a Te alloy-semiconductor. This same technique can be extended to any compound semiconductor where the stable form of the anion is a p type material in comparison to the bulk semiconductor and where it is reasonably conductive. To be effective, the metal atom must also have a much higher reaction rate in the etch than the more electronegative atoms within the crystal which is usually the case. In these situations, an additional ohmic contact such as gold or aluminum can be overlaid to minimize surface resistance and the contact used as the p terminal in a PIN structure. In preferred embodiments, the nitric acid/phosphoric acid etchant has nitric acid concentrations ranging from 0.1% to 5.0% by volume. The Te-enriched region form thusly functions as the P-type contact on the compound, alloy-semiconductors.

Figure 7:
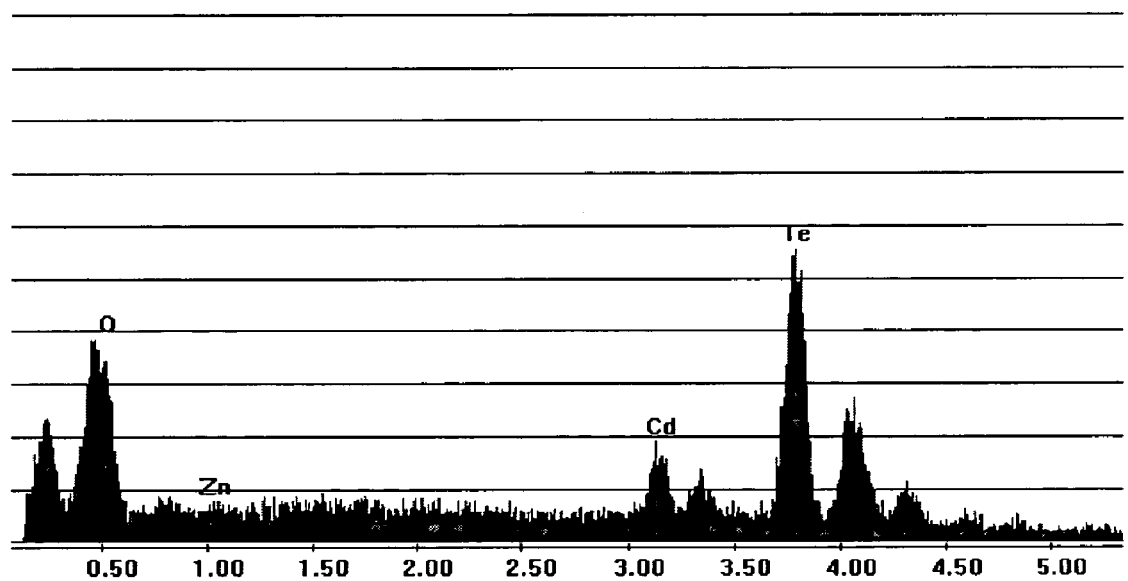
FIG. 7 is the SEM atomic fluorescence spectrum of the tellurium-enriched layer on a CdZnTe semiconductor.

In a more preferred embodiment of the present invention, the nitric acid/phosphoric acid (NP) etchant is a solution of $HNO_3$, distilled $H_2O$; and $H_3PO_4$, in a ratio of 2:33:85 by volume. In one preferred method the bulk alloy-semiconductor was submerged in NP etchant for two minutes, then rinsed with de-ionized water and methanol. After such etching in the NP solution, the exposed surfaces show a surface either metallic and shined, indicating a crystalline growth or a more dull brown color indicating an amorphous formation when compared to the native crystal material. SEM measurements were performed on the etched surface. The spectral results show a Te-enriched layer with a concentration up to 82.15 At % Te. The SEM atomic fluorescence spectrum taken on Te-rich layer is provided in FIG. 7. One can easily see the enhancement in the Te line when compared to the native material spectrum shown in FIG. 6. In all of these measurements, we expect the electrons from the SEM to penetrate somewhat further than just the surface layer, which explains why some of the residual peaks of the native material spectrum remain as backgrounds.

In another preferred embodiment of the present invention, Au or other P-type metals can be deposited on the Te-enriched region to passivate the Te layer and to produce a truly ohmic contact. Such a contact may be effected with either vacuum deposited metal or electrodeless chemical exchange methods.

With the construction of both the N-type region and the P-type region, the semiconductor now can be characterized as a PIN type semiconductor device. The depleted or intermediate region extends from the inner surface of the N-type region to the inner surface of the P-type region, extending through the entire volume of the semiconductor but for the rectifying contacts. Such a semiconductor device will exhibit diode properties with high conduction in the forward direction and low conductivity in the reverse direction. The effectiveness of the PIN structure has been tested by evaluating the detection efficiency of such a structure against a device made with ohmic contacts on the same piece of bulk material. To within very small limits, the efficiency in detecting fully penetrating gamma rays that interrogate the depleted region of devices made either way are identical.

In another embodiment of the present invention, reliable P-type tellurium contacts can be produced on the P-type side using various methods, including metal deposition. Such metal contacts are thin and often form oxide layers forming a metal oxide junction with the semiconductor. This results in the formation of a PIN structure semiconductor having both an extended depletion region and decreased leakage characteristics relative to a conventional ohmic contact. These methods are exactly analogous to processing normally used in the semiconductor industry. Application of Au or Pt results in a P type contact that can also be verified by a corresponding I/V curve. While these methods also result in a PIN structure, they are still subject to the initial concerns about surface conditions and metal purity. In the chemically formed contact, the fact that material is removed from the native crystal removes this concern.

Figure 8:
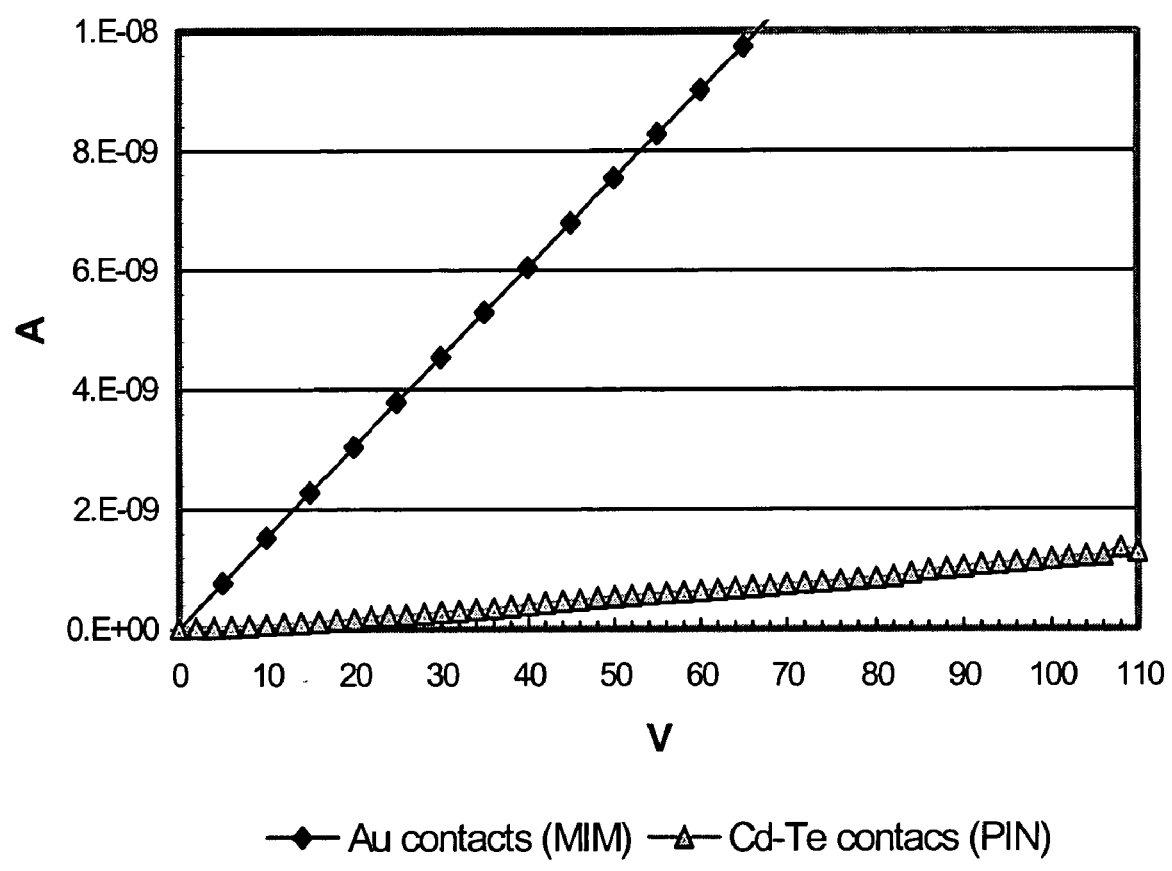
FIG. 8 is a graph of the comparison of the voltage-current characteristics taken on bulk CdZnTe semiconductor devices, one employing Au (MIM) contacts and the other employing Cd/Zn—Te (PIN) contacts.
Figure 9:
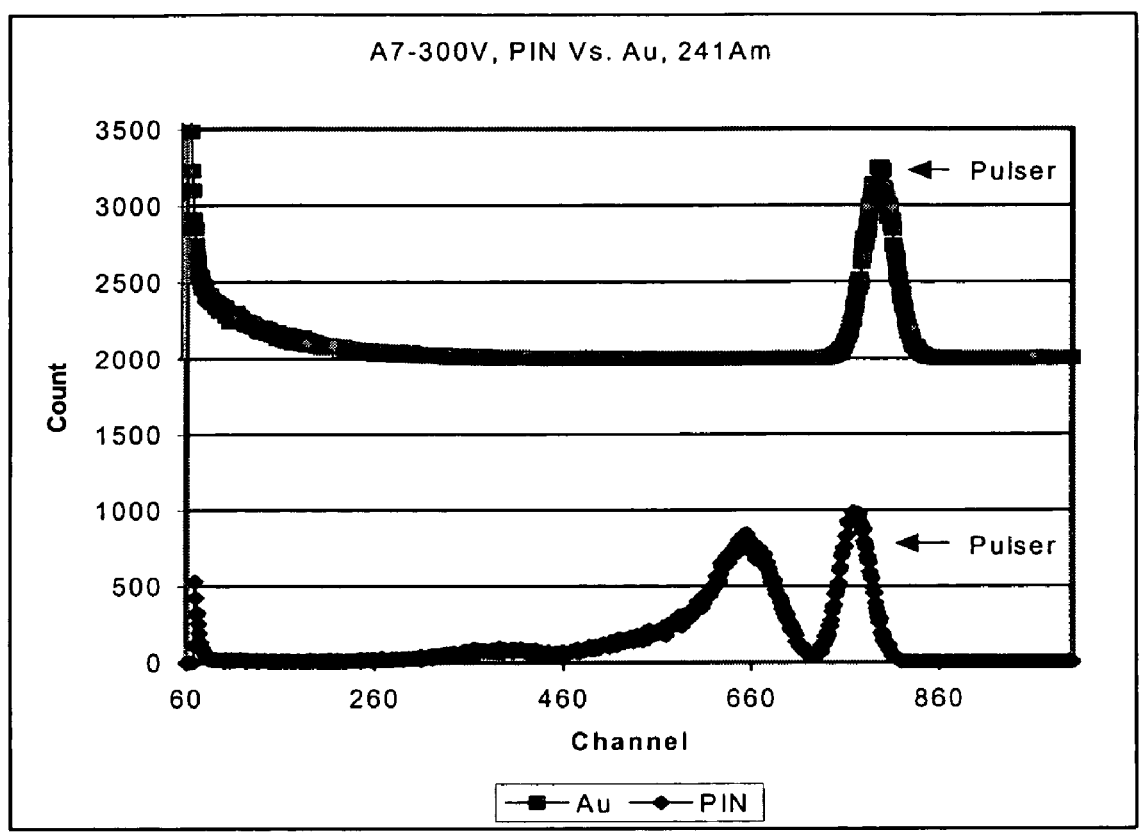
FIG. 9 is the CdZnTe pulse height spectra of the same piece of material fabricated with first a NIN structure and then a PIN device, using $^{241}$Am radiation source.

Voltage-current measurements were performed on CdZnTe semiconductor devices employed as radiation detector, one with Au—Au (MIM) contacts and the other with Cd/Zn—Te (PIN) contacts. FIG. 8 provides the voltage-current measurements for the CdZnTe semiconductor devices. This graph demonstrates that the leakage current of the PIN device of the present invention is several orders of magnitude smaller that the leakage current of the MIM device, as the applied bias voltage is increased. For material of moderate resistivity, for example materials having >$10^{10}$ Ω-cm., the leakage current of the PIN structure of the present invention is more than 10 times smaller than that of the MIM device. Pulse height spectra were also measured for both structures using an $^{241}$Am radiation source. The spectral comparison is provided in FIG. 9. Using an external pulser, at 300 V bias voltage, the MIM structure with Au contacts shows either no radiation response or a radiation response entirely masked by high noise level of the device. This high noise level is a result of the high leakage current. In sharp contrast, the PIN structure of the present invention, having Cd/Zn-enriched and Te-enriched contacts, provides a well-resolved radiation pulse.

It will be appreciated that these rectifying contacts or junctions are formed in an ideal environment since there are formed by subtracting from a portion of the crystalline surface rather than depositing another material onto the surface. This process eliminates any problems of surface oxidation or impurities since the material is formed directly from the composition of the bulk crystal.

Figure 10:
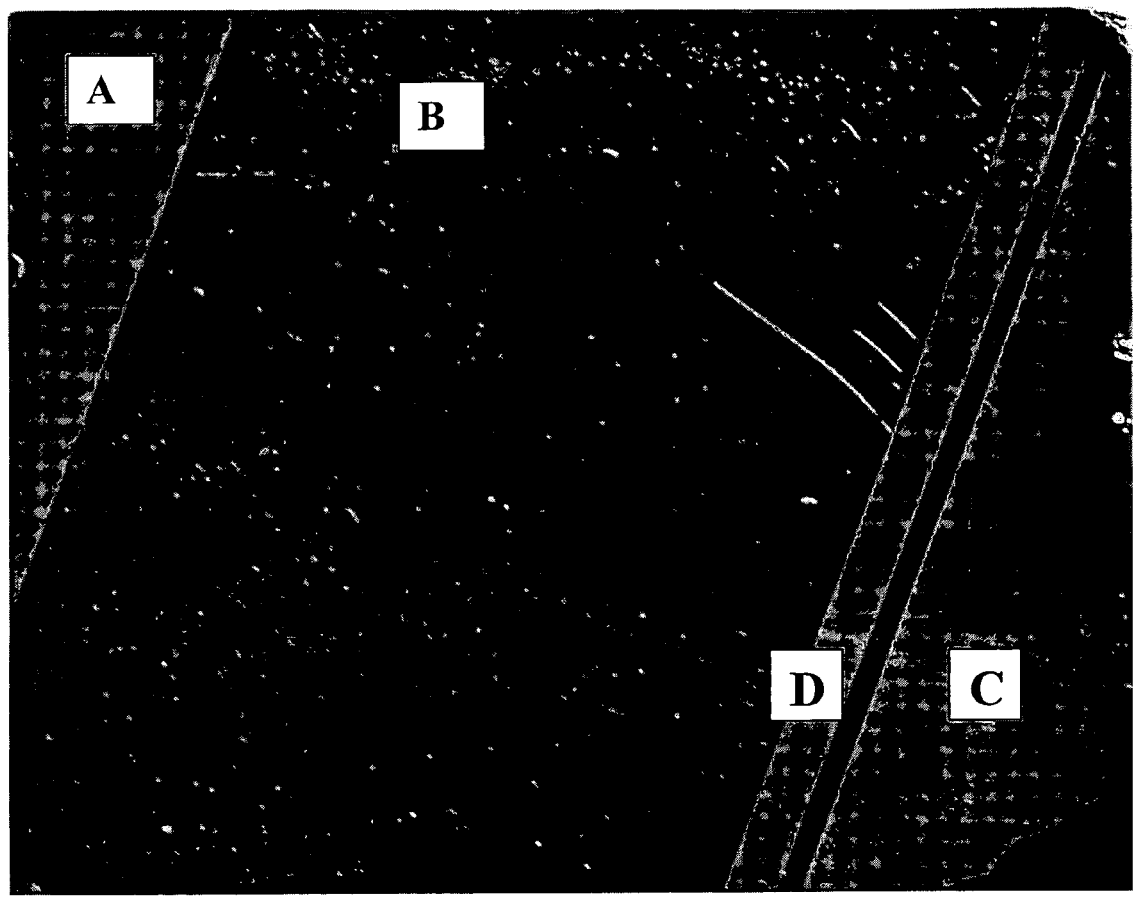
FIG. 10 is a photograph illustrating the surface morphology of a CdZnTe substrate overlaid with a Cd/Zn-rich layer formed by photo-electrochemical etching process of the present invention.

Another aspect of the present invention is the ability to ascertain grain structure and surface morphology of an alloy-semiconductor. In semiconductor wafer processing, knowledge of surface morphology and crystalline structure enhances the yield of single crystalline substrates. This results in significant cost reduction by avoidance of defect regions. The method of forming rectifying contacts on alloy-semiconductors of the present invention provides an efficient and effective means for visualizing grain structure and surface morphology. For example, FIG. 10 is a photograph of an CdZnTe alloy-semiconductor formed by photo-electrochemical process of the present invention, in which the surface morphology of the CdZnTe substrate overlaid with a Cd/Zn-enriched film is clearly revealed. Examination of FIG. 10 discloses several different regions within this substrate. Regions A and B are single crystalline materials with different orientations. Regions A and C may have the same orientation, while Region D is most likely a twin band and, thus, a defect region. Such crystal defects are well known to act as electron and hole traps, thus decreasing the performance of the semiconductor. It will be appreciated that the ability to visualize the grain structure and surface morphology of an alloy-semiconductor would permit ready isolation of a single crystalline material without any defect. Devices, such as radiation detectors and photovoltaic cells, fabricated from such single crystalline material will exhibit superior performance.

Thus, an aspect of the present invention provides a method for distinguishing grain boundaries, single crystalline regions, and defect regions of alloy-semiconductors. The surface morphology of the alloy-semiconductor is well decorated by Cd, revealing single crystalline regions, structural defects, grain boundaries, twinning, cracking and piping. Accordingly, the present invention provides a method for avoiding defect regions and, consequently, increasing the yield of single crystalline material.

For the material illustrated in FIG. 10, the surface resistances of Regions A, B and C were measured using a micro-probe and voltage meter. Region B exhibited very high resistance, >1 GΩ, which indicates a superior CdZnTe region. Regions A and C have resistance in the range of 130 MΩ. The method of the present invention, thus, permits measurement of the surface resistance (or conductivity) distribution across the alloy-semiconductor. Such information allows surface patterning, surface treatment and microelectronic design of alloy-semiconductors.

To provide increased differentiation between the two etching rates, a retarding electrochemical potential can be introduced into the etch solution which will further favor the etching rate of the cadmium and zinc over tellurium. This effect is a result of modifying the effective reaction rates in an electrochemical reaction with the addition of an external potential. Each component of the crystal have an effective electrochemical potential and when an oxidation or reduction reaction takes place, its rate is moderated by the relative difference in chemical electropotentials. Applying an external potential to the reaction changes the effective zero point in the process and hence the reaction rates. One can modify the ratio of the net resultant potential differences, and hence reaction rates, in such a way, that the ratio for two competing reactions is made much larger than it would be in a free chemical situation. In such cases, the absolute rates of the individual reactions are also slowed or enhanced but it is the ratio of rates that determines the amount of material removed. The use of an external potential can also be used to vary the Cd and Zn ratio on the n type surface by the same argument. Whether or not the external potential is used, our measurements indicate that one can make a surface that is highly enriched in tellurium which forms perfect P contact. One can connect to this semimetal layer using any conventional metallization process to make the overall contact to the tellurium ohmic.

In yet another preferred embodiment of the present invention, a high intensity light is used to increase the photoconductivity of the high resistivity semiconductor. In this process, one can use a light whose peak emission is near the band gap cut off of the material. This is typically between 900 and 1000 micron wavelength for alloys such as CZT. A suitable source can be an ordinary incandescent heat lamp that peaks in this wavelength region. In current experiments, a commercial, 250 watt therapeutic IR lamp has been used to produce this accelerated photochemical reaction.

In yet another embodiment of the present invention, current is carefully controlled to regulate the speed of deposition and the rate of evolution of gas. A current of 1 to 10 milliamperes has proven effective at producing a good contact. If higher currents are used, the metal contact formed tends to become highly stressed and breaks away from the native crystal.

Another preferred embodiment of the present invention entails a protected surface of the crystal that is at negative polarity to the free carbon electrode within the electrochemical cell. Additional masking may be provided over the crystal to limit masking where the contacts will form.

The method of the present invention uses an in-situ etching process to remove part of a chemical component from a detector and leaving the other component as P- and N-type contacts. The system and method for forming rectifying junctions involves no external contamination; no oxide layer to degrade device performance; a room temperature process and easy to produce fine contacts; lower leakage between adjacent contacts as a result of the recessed nature of etch; higher internal electric field capability to improve charge collection; lower leakage current; lower cost to produce; and high yield of single crystalline materials.

The systems and methods of the present invention provide alloy-semiconductors, more particularly, CdTe and CdZnTe alloy-semiconductors, with rectifying contacts. The systems and methods of the present invention also supply alloy-semiconductors, more particularly, CdTe and CdZnTe alloy-semiconductors, in which single crystalline substrates are employed. These aspects of the present invention permit the construction of more sensitive and more accurate radiation detectors. Such radiation detectors would serve a variety of significant applications.

For example, U.S. Nuclear Regulatory Commission (NRC) regulations governing "source material" establish a threshold for licensing at 0.05 percent by weight uranium (U) and/or thorium (Th) by weight. Manufacturers of materials containing natural radionuclides, including ores of zircon, tin, titanium, vanadium, columbium, and phosphates, are careful to maintain U and Th levels below NRC's licensing threshold to avoid the added burdens and expense of an NRC license. Users of these products periodically check incoming materials to confirm that suppliers are not delivering licensable materials. Regulatory authorities, on the other hand, will from time to time evaluate materials in commerce or wastes to confirm that unlicensed material is not being improperly handled.

The current methods of confirming U and Th content in mineral or soil matrices are gamma spectroscopy, x-ray fluorescence (XRF) or nuclear activation analysis (NAA). Gamma spectroscopy and XRF are advantageous in that measurements may be made quickly in the laboratory, but measurement variability can be high, particularly in mineral matrices, and thus a level of uncertainty is present with these methods. NAA affords an accurate measurement of U and Th parent isotopes, but is time consuming, expensive, and only a limited number of laboratories can perform this analysis. The present invention provides a radiation detector for rapid method for quantitation of U and Th in soil or mineral matrices with improved measurement precision and accuracy and, thus, has wide commercial application for industries who must maintain compliance with NRC licensing rules and regulatory authorities who are charged with enforcing those rules.

Further applications include quantitation of radionuclides in soil, pursuant to cleanup of former defense industry sites under the U.S. Army Corps of Engineers' Formerly Utilized Site Remedial Action Program (FUSRAP). Additional applications include industrial property remediation to state standards, which are increasingly targeting remediation of radionuclides in soil to very low levels.

An additional applications of the present invention include surveying consignments of goods during trans-boundary movement. Currently, United States and foreign governments are concerned about the unlawful export or import of radioactive materials having fissile or fertile properties that could be used for weapons. Many ports of entry are equipped with scintillation detectors for surveying bulk cargo and customs inspectors routinely scan consignments with hand-held survey meters. Problems for shippers or consignees can arise where naturally occurring radioactive materials (e.g., minerals, refractories, Brazil nuts) are present at levels slightly above background, but sufficient to trigger an alarm on a sensitive scintillation monitor. Often, the consignment is impounded and serious delays are incurred until the authorities can confirm that weapons-related materials are not involved. The present invention offers improved accuracy in identifying isotopes of concern and, thus, would streamline the goods inspection process and allow authorities to focus their resources on materials of genuine concern. Similar situations are presented in the scrap recycling industry, where a concern over lost sources (e.g., $^{60}Co$, $^{137}Cs$) has given rise to widespread use of sensitive portal monitors and consequent rejection of whole consignments of scrap metal due to the presence of trivial amounts of U, Th in refractory or foundry sand. Similarly, portal monitors at landfills often result in unwarranted rejections due to U, Th in foundry sands or spent refractory.

In addition to regulatory compliance concerns discussed above, the minerals industry has a need for rapidly assessing metals in mineral samples. For instance, in the titanium dioxide ($TiO_2$) white pigment industry, the presence and quantity of iron as an impurity can determine the quality and ultimate price of a consignment of this mineral product. Similarly, metals impurities can adversely affect quality and performance of zircon ($ZrSiO_4$) and zirconia ($ZrO_2$) ceramics used for precision casting of high performance alloys or in specialty electronics applications. Again radiation detectors employing alloy-semiconductors formed by the process of the present invention would permit these applications.

Additionally, there have been recent litigation regarding alleged radionuclide contamination involving different environmental media: real property (e.g., buildings, soil), drinking water supplies, and sewage sludge (i.e., by discharge to a publicly owned treatment works). These cases involved not only NRC specific materials licensees, but also persons engaged in oil and gas production (through $^{226}$Ra accumulation in pipe scale and $^{210}$Po plating on natural gas compressors), minerals beneficiation, and phosphate production. The ability to perform a rapid, accurate site survey using a radiation detector of the present invention would be a significant benefit here, as well.

In addition, another application of the present technology is in the construction of large array X-ray detectors. In medical imaging, there is growing interest in using large MOS photoarrays to obtain increased sensitivity and visualization. At present, amorphous selenium is considered as a potential material for the detector. However, such materials would require thicker substrates so as to reduce radiation leakage. The junction of the present invention permits construction of a detector with high sensitivity with lower leakage.

Various preferred embodiments of the invention have been described in fulfillment of the various objects of the invention. It should be recognized that these embodiments are merely illustrative of the principles of the invention. Numerous modifications and adaptations thereof will be readily apparent to those skilled in the art without departing from the spirit and scope of the present invention.

What is claimed is:

1. A method for forming a rectifying junction on an alloy-semiconductor material comprising a compound comprising a first component and a second component, the method comprising:
    photo-electrochemical removal of the first component of a first portion of the alloy-semiconductor material to form an N-type region enriched in the second component; and
    substantially removing the second component from a second portion of the alloy-semiconductor material to form a P-type region enriched in the first component.

2. The method according to claim 1, wherein the step of removing the second component from a second portion of the alloy-semiconductor material comprises chemical etching.

3. The method according to claim 1, wherein the alloy-semiconductor material is selected from the group consisting of CdTe, CdZnTe, HgZnCdTe, and HgCdZnSe.

4. The method according to claim 1, further comprising the step of providing a contact on the P-type region to form a P-I-N rectifying junction.

5. The method of claim 4, wherein the contact is selected from the group consisting of gold, tellurium, and platinum.

6. A method for forming a rectifying junction on an alloy-semiconductor material, the method comprising the steps of:
    providing the alloy-semiconductor material having at least a first element and a second element, wherein the alloy-semiconductor has a first region and a second region substantially separated by an intermediate region;
    substantially removing the first element from the first region, wherein the removal of the first element from the first region substantially forms a region of substantially enriched material of the second element, and wherein the removal of the first element from the first region substantially forms a negatively doped material in the first region to act as an N-type region;
    substantially removing the second element of the second region, wherein the removal of the second element of the second region forms a positively doped material in the second region to act as a P-type region; and
    providing a contact on the P-type region, wherein the N-type region, the intermediate region and the P-type region with the contact substantially form a P-I-N rectifying junction.

7. The method of claim 6, wherein the removal of the first element occurs by photo-electrochemical removal.

8. The method of claim 6, wherein the removal of the second element occurs by etching.

9. The method of claim 6, wherein the contact is selected from the group consisting of gold, tellurium, or platinum.

10. The method of claim 9, wherein the contact is provided with either vacuum deposited metal or electrodeless chemical exchange methods.

11. The method of claim 6, wherein the alloy-semiconductor material is selected from the group consisting of CdTe, CdZnTe, HgZnCdTe, and HgCdZnSe.

12. A method for forming a rectifying junction on an alloy-semiconductor, the method comprising the steps of:
    applying an N-type material on a first region of the alloy-semiconductor;
    heating the N-type material on the alloy-semiconductor;
    photo-electrochemical etching the N-type material;
    substantially covering the N-type material for protection;
    chemically etching a second region of the alloy-semiconductor to form P-type material; and
    applying a contact to the P-type material to form a P-I-N rectifying junction.

13. The method of claim 12, wherein the N-type material is removable and conductive.

14. The method of claim 13, wherein the N-type material is Hg—In eutectic paste.

15. The method of claim 13, wherein the photo-electrochemical etching comprises the steps of:
    coating the N-type material with a non-conductive material;
    submerging an electrode in an electrolyte solution;
    connecting the electrode to a positive terminal of the power supply; and
    applying a light source having a median energy approximate to the band gap of the alloy-semiconductor material.

16. The method of claim 12, wherein the contact is selected from the group consisting of gold, tellurium, and platinum.

* * * * *